(12) United States Patent
Zhou et al.

(10) Patent No.: US 8,195,963 B2
(45) Date of Patent: Jun. 5, 2012

(54) CIRCUIT FOR CONTROLLING TIME SEQUENCE

(75) Inventors: Hai-Qing Zhou, Shenzhen (CN); Jin-Liang Xiong, Shenzhen (CN)

(73) Assignees: Hong Fu Jin Precision Industry (ShenZhen) Co., Ltd., Shenzhen, Guangdong Province (CN); Hon Hai Precision Industry Co., Ltd., Tu-Cheng, New Taipei (TW)

( * ) Notice: Subject to any disclaimer, the term of this patent is extended or adjusted under 35 U.S.C. 154(b) by 539 days.

(21) Appl. No.: 12/409,533

(22) Filed: Mar. 24, 2009

(65) Prior Publication Data

US 2010/0211811 A1    Aug. 19, 2010

(30) Foreign Application Priority Data

Feb. 17, 2009   (CN) .......................... 2009 1 0300443

(51) Int. Cl.
  *G06F 1/26* (2006.01)
(52) U.S. Cl. .............................. 713/300; 713/1; 713/330
(58) Field of Classification Search ................... 713/1, 2, 713/300, 330
  See application file for complete search history.

(56) References Cited

U.S. PATENT DOCUMENTS

| | | | |
|---|---|---|---|
| 6,693,410 B1 * | 2/2004 | Terrien | 323/274 |
| 2008/0258927 A1 * | 10/2008 | Chen et al. | 340/661 |
| 2009/0125731 A1 * | 5/2009 | Huang et al. | 713/300 |
| 2011/0169467 A1 * | 7/2011 | Pan et al. | 323/282 |

* cited by examiner

*Primary Examiner* — Paul Yanchus, III
(74) *Attorney, Agent, or Firm* — Altis Law Group, Inc.

(57) ABSTRACT

A circuit for controlling time sequence of a motherboard to supply power for a motherboard component includes a control circuit, a switch circuit, and a power conversion circuit. The control circuit is configured for receiving a startup signal during turning on the motherboard. The startup signal is configured to turn off the control circuit to delay a first voltage signal received by the first power receiving terminal for a period of time before outputting a new voltage signal. The switch circuit is configured for being turned off under the control of the new voltage signal. The power conversion circuit is configured for converting a second voltage signal into a supply voltage in response to the switch circuit being turned off, to provide the supply voltage to the motherboard component.

13 Claims, 4 Drawing Sheets

CIRCUIT FOR CONTROLLING TIME SEQUENCE

BACKGROUND

1. Technical Field

The present disclosure relates to circuits for controlling time sequence, and particularly to a circuit for controlling time sequence of a motherboard of a computer.

2. Description of Related Art

Operation of an electronic device or a component, such as a motherboard of a computer, may have special time sequence requirements during turning on or shutting off the computer. Generally, time sequence of the component can keep the computer working normally.

For example, when the computer is turned on, a power receiving terminal may receive a 3.3V system power supply before a north bridge chip on the motherboard receives a 1.25V system power supply, and when the computer is shut off the reverse is true. However, if the time sequence is not followed, the computer may not work properly.

DETAILED DESCRIPTION

Figure 1:
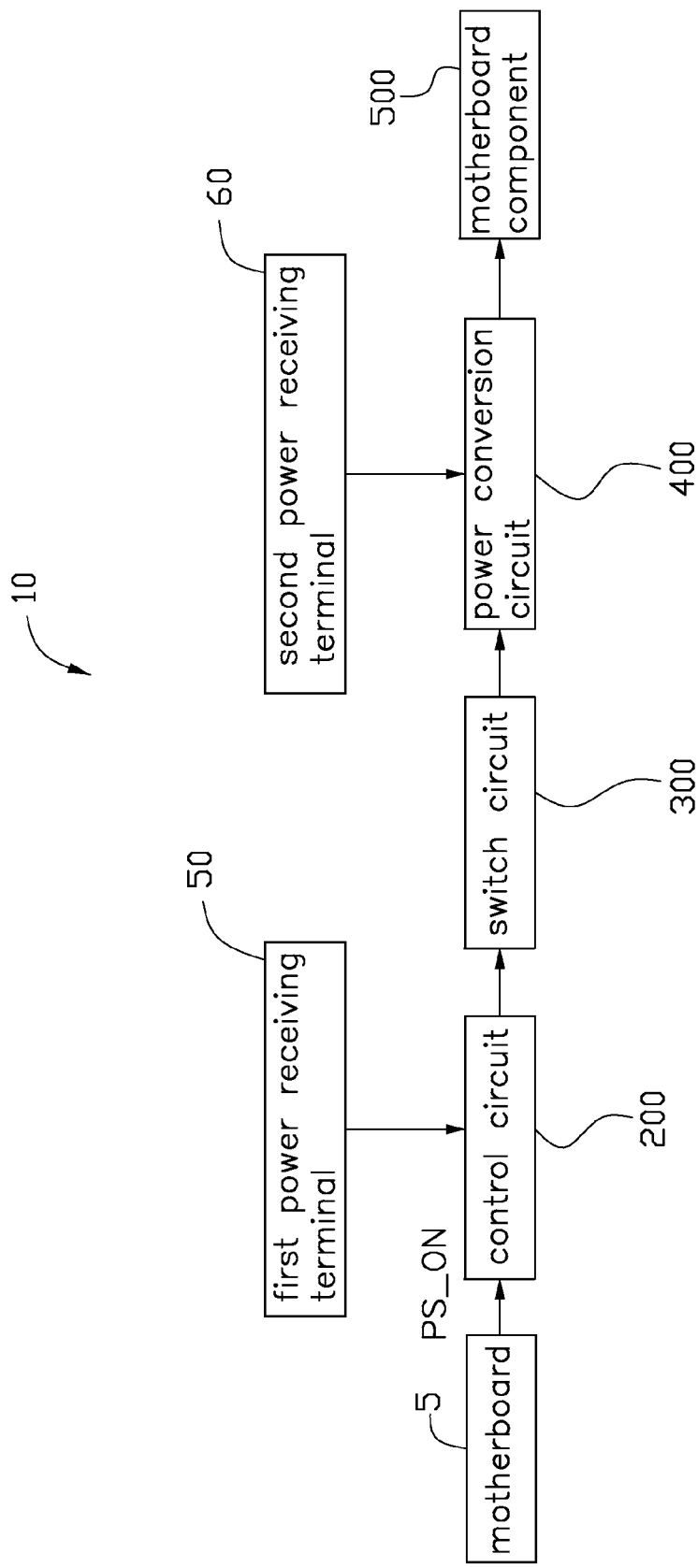
FIG. 1 is a block diagram of an exemplary embodiment of a circuit for controlling time sequence, together with a motherboard component.

Referring to FIG. 1, an exemplary embodiment of a circuit 10 for controlling time sequence is configured for controlling time sequence of a motherboard 5 of a computer during turning on or shutting off the computer. The circuit 10 includes a control circuit 200, a switch circuit 300, and a power conversion circuit 400.

The control circuit 200 is connected to a startup signal output terminal on the motherboard 5 to receive a startup signal PS_ON, and is also connected to a first power receiving terminal 50 to receive a first voltage signal. The control circuit 200 is connected to the power conversion circuit 400 via the switch circuit 300. The power conversion circuit 400 is connected to a second power receiving terminal 60 to receive a second voltage signal, and is also connected to a motherboard component 500 to provide a converted voltage signal to the motherboard component 500. In one embodiment, the motherboard component 500 can be a north bridge chip, or a south bridge chip.

The circuit 10 is configured so that the first power receiving terminal 50 receives the first voltage signal before the motherboard component 500 receives the converted voltage signal during turning on the computer, and during shutting off the computer, the converted voltage signal to the motherboard component 500 is shut off before the first voltage signal to the terminal 50 is shut off.

In detail, when the computer is turned on, the control circuit 200 receives the startup signal PS_ON output from the startup signal output terminal of the motherboard 5. The control circuit 200 is turned off. The first voltage signal received by the first power receiving terminal 50 is delayed for a period of time by the control circuit 200 before being output to the switch circuit 300. The switch circuit 300 is turned off. The power conversion circuit 400 then converts the second voltage signal received by the second power receiving terminal 60 into a supply voltage to the motherboard component 500. Thus, the first power receiving terminal 50 receives the first voltage signal before the motherboard component 500 receives the converted voltage signal.

When the computer is shut off, there is no output from the startup signal output terminal for the startup signal PS_ON. The control circuit 200 is turned on to immediately turn on the switch circuit 300. The power conversion circuit 400 stops supplying power to the motherboard component 500. The first voltage signal received by the first power receiving terminal 50 discharges from a motherboard internal circuit (not shown), and gradually drops to zero volts. Thus, the converted voltage signal to the motherboard component 500 is shut off before the first voltage signal to the first power receiving terminal 50 is shut off during shutting off the computer.

Figure 2:
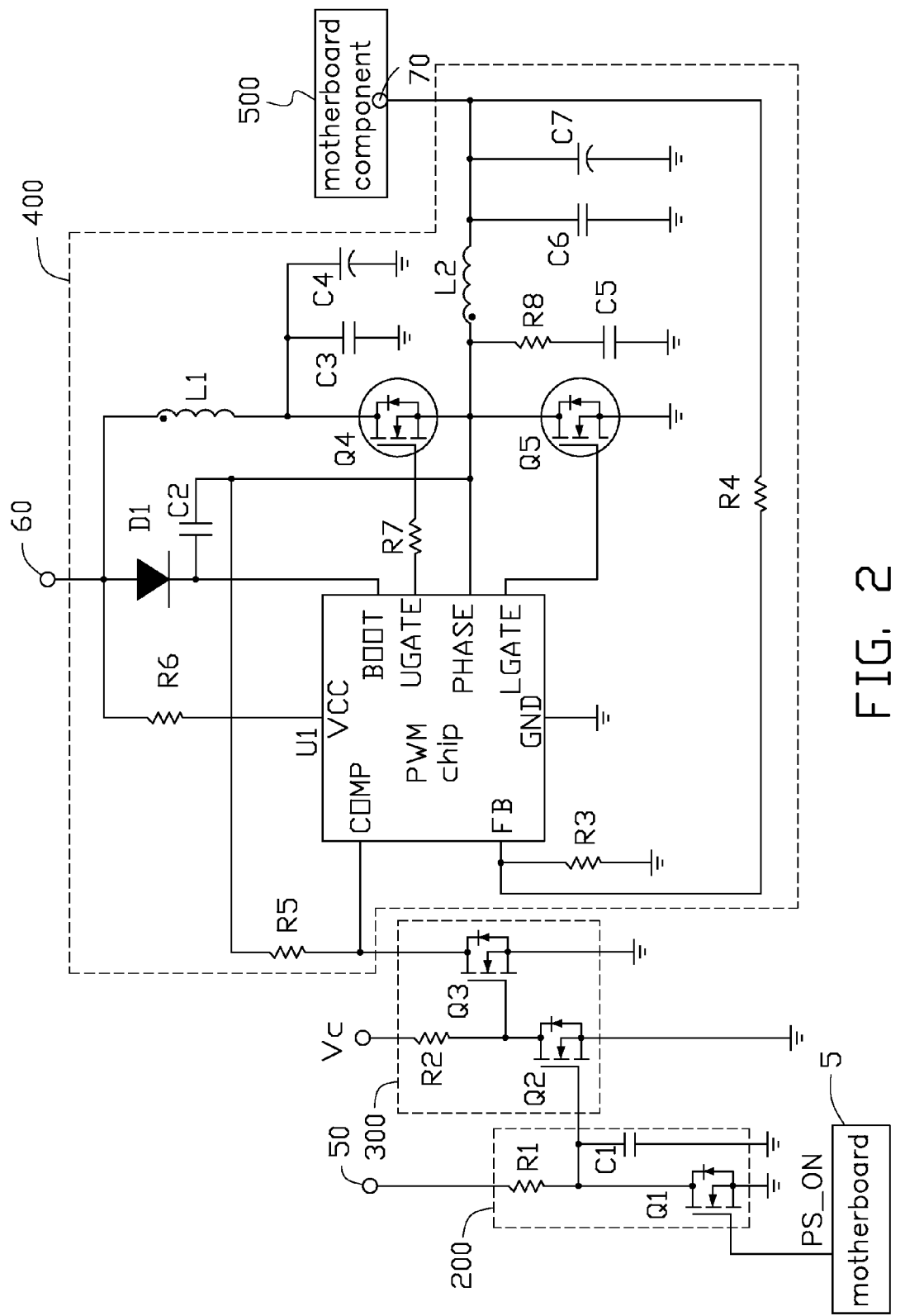
FIG. 2 is a circuit diagram of an exemplary embodiment of the circuit of FIG. 1.

Referring to FIG. 2, the control circuit 200 includes a field effect transistor (FET) Q1, a resistor R1, and a capacitor C1. A gate of the FET Q1 is connected to the startup signal output terminal to receive the startup signal PS_ON. A source of the FET Q1 is grounded. A drain of the FET Q1 is connected to the first power receiving terminal 50 via the resistor R1, and is also connected to the switching circuit 300. The capacitor C1 is connected between the drain of the FET Q1 and ground.

The switch circuit 300 includes a resistor R2, and two FETs Q2 and Q3. A gate of the FET Q2 is connected to the drain of the FET Q1. A drain of the FET Q2 is connected to a power supply Vc via the resistor R2. A source of the FET Q2 is grounded. A gate of the FET Q3 is connected to the drain of the FET Q2. A drain of the FET Q3 is connected to the power conversion circuit 400. A source of the FET Q3 is grounded.

The power conversion circuit 400 includes a pulse width modulation (PWM) chip U1, six resistors R3-R8, a diode D1, six capacitors C2-C7, two inductors L1 and L2, and two FETs Q4 and Q5. The PWM chip U1 includes a power supply terminal VCC, a ground terminal GND, an initialization pin BOOT, a high pass pin UGATE, a low pass pin LGATE, a phase pin PHASE, a comparison pin COMP, and a feedback pin FB. The feedback pin FB is grounded via the resistor R3, and is also connected to a power terminal 70 of the motherboard component 500 via the resistor R4. The comparison pin COMP is connected to the drain of the FET Q3, and is also connected to the phase pin PHASE via the resistor R5. The power supply terminal VCC is connected to the second power receiving terminal 60 via the resistor R6. The initialization pin BOOT is connected to a cathode of the diode D1, and is also connected to the phase pin PHASE via the capacitor C2. An anode of the diode D1 is connected to the second power receiving terminal 60. The high pass pin UGATE is connected to a gate of the FET Q4 via the resistor R7. A drain of the FET Q4 is connected to the second power receiving terminal 60 via the inductor L1, and is also grounded via the capacitors C3 and C4 in parallel. A source of the FET Q4 is connected to a drain of the FET Q5 and the phase pin PHASE, grounded via the resistor R8 and the capacitor C5 in series, and also connected to the power terminal 70 of the motherboard component 500 via the inductor L2. A gate of the FET Q5 is connected to the low pass pin LGATE. A source of the FET Q5 is grounded. The power terminal 70 of the motherboard component 500 is also grounded via the capacitors C6 and C7 in parallel.

In this embodiment, the FETs Q1-Q5 as electronic switches can be n-channel metal oxide semiconductor (NMOS-FETs). In other embodiments, the FETs Q1-Q5 may be other types of electronic switches, such as NPN transistors.

In this embodiment, the first power receiving terminal 50 may receive about a 3.3V system power supply, the second power receiving terminal 60 may receive about a 12V system power supply, and the power supply Vc may be about a 5V stand by power supply. The capacitors C1, C2, C3, C5, and C6 may be ceramic capacitors, and the capacitors C4 and C7 may be electrolytic capacitors. In other embodiments, the capacitors C4 and C7 may also be other types of capacitors, such as solid state capacitors, and other types of power conversion circuit can provide power supply to the motherboard component 500.

The following depicts a different time sequence of the circuit 10 wherein the first power receiving terminal 50 receives the first voltage signal before the motherboard component 500 receives the converted voltage signal during turning on the computer, and during shutting off the computer, the converted voltage signal to the motherboard component 500 is shut off before the first voltage signal to the first power receiving terminal 50 is shut off.

Figure 3:
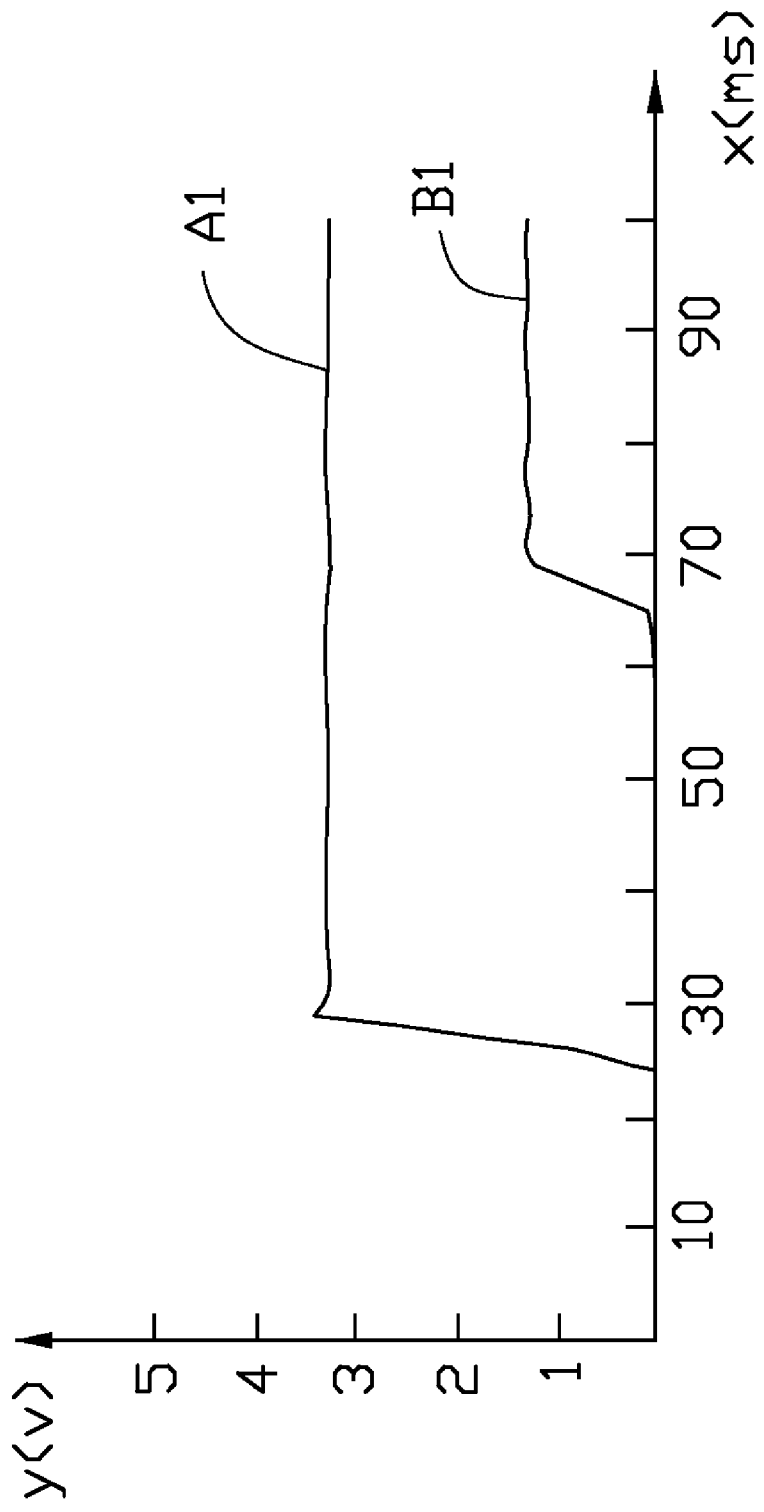
FIG. 3 is a time sequence curve of the circuit for controlling time sequence of FIG. 2 during turning on a computer.

When the computer is turned on, the startup signal PS_ON output from the startup signal output terminal is at a low level about 0 volts, the FET Q1 is turned off, and the first voltage signal received by the first power receiving terminal 50 charges the capacitor C1 via the resistor R1. After the capacitor C1 is charged for a period of time, the FET Q2 is turned on, the gate of the FET Q3 is at low level about 0 volts, and the FET Q3 is turned off. The comparison pin COMP of the PWM chip U1 is at high level about 5 volts. The high pass pin UGATE and the low pass pin LGATE output high leveled volt about 5 volts to alternately turn on the FETs Q4 and Q5. When the FET Q4 is turned on, the second voltage signal received by the second power receiving terminal 60 is transmitted to the power terminal 70 of the motherboard component 500 via the inductor L1, the capacitors C3 and C4, the resistor R8, the capacitor C5, the inductor L2, and the capacitors C6 and C7. When the FET Q5 is turned on, the inductor L2 discharges, and supplies power to the power terminal 70 of the motherboard component 500 via the capacitors C6 and C7. As shown in FIG. 3, from time sequence curve A1 of the first power receiving terminal 50 receiving the first voltage signal and the time sequence curve B1 of the power terminal 70 of the motherboard component 500 receiving the converted voltage signal, a conclusion can be drawn that the first power receiving terminal 50 receives the first voltage signal before the motherboard component 500 receives the converted voltage signal.

Figure 4:
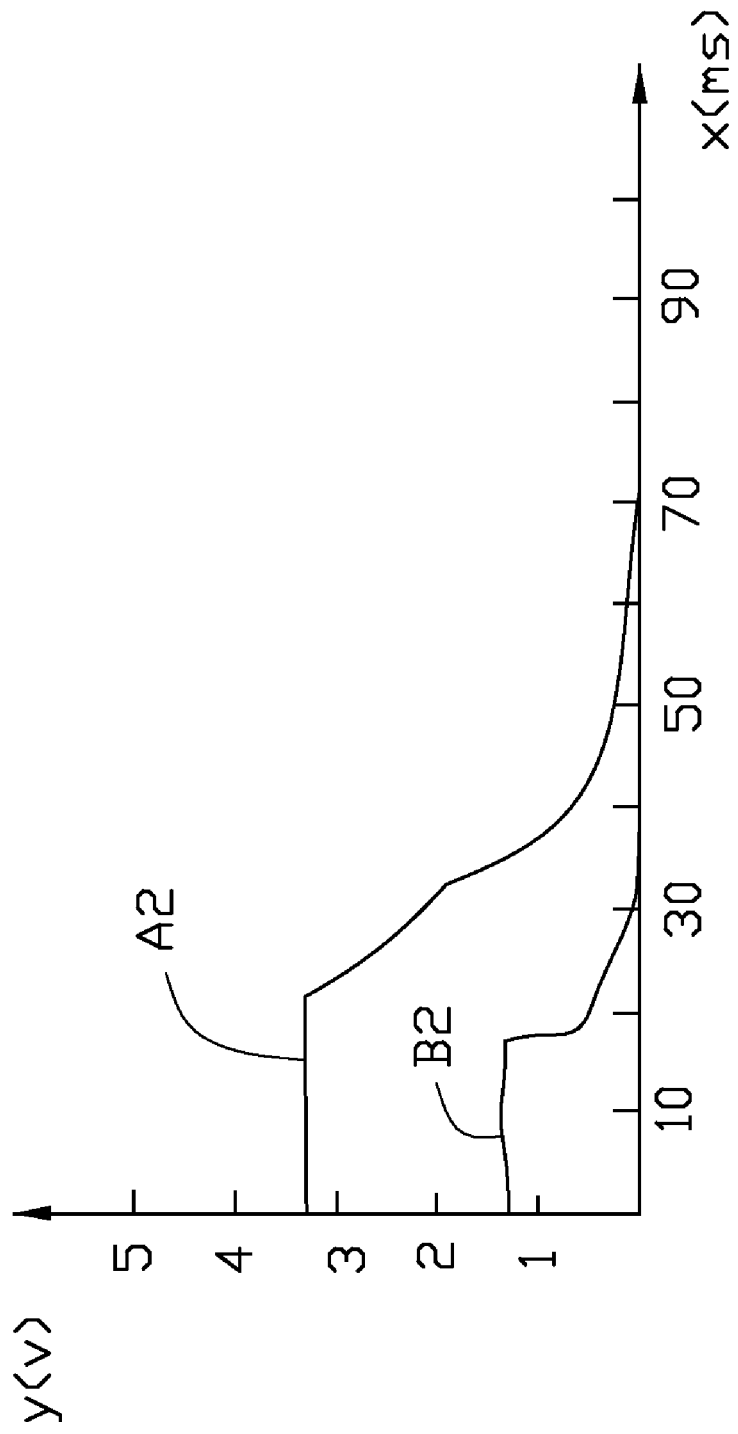
FIG. 4 is a time sequence curve of the circuit for controlling time sequence of FIG. 2 during shutting off a computer.

When the computer is shut off, the startup signal output terminal does not output the startup signal PS_ON, and the gate of the FET Q1 is at high level about 5 volts and the FET Q1 is turned on. The capacitor C1 quickly discharges via the FET Q1, and the FET Q2 is turned off. The gate of the FET Q3 is at high level about 5 volts, and the FET Q3 is turned on. The comparison pin COMP of the PWM chip U1 is at low level about 0 volts, and the PWM chip U1 stops supplying power to the motherboard component 500. The first voltage signal received by the first power receiving terminal 50 discharges via the internal circuit of the motherboard 5 and gradually drops to zero volts. As shown in FIG. 4, from the time sequence curve A2 of the first power receiving terminal 50 receiving the first voltage signal and the time sequence curve B2 of the power terminal 70 of the motherboard component 500 receiving the converted voltage signal, a conclusion can be drawn that the converted voltage signal to the motherboard component 500 is shut off before the first voltage signal to the first power receiving terminal 50 is shut off.

It is to be understood, however, that even though numerous characteristics and advantages of the embodiments have been set forth in the foregoing description, together with details of the structure and function of the embodiments, the disclosure is illustrative only, and changes may be made in detail, especially in matters of shape, size, and arrangement of parts within the principles of the embodiments to the full extent indicated by the broad general meaning of the terms in which the appended claims are expressed.

What is claimed is:

1. A circuit for controlling time sequence of a motherboard to supply power for a motherboard component, comprising:
    a control circuit connected to a startup signal output terminal to receive a startup signal during turning on the motherboard, wherein the startup signal is configured to turn off the control circuit to delay a first voltage signal received by a first power receiving terminal for a period of time before outputting a new voltage signal;
    a switch circuit connected to the control circuit and configured to be turned off under the control of the new voltage signal;
    a power conversion circuit connected between the switch circuit and a second power receiving terminal, wherein the power conversion circuit converts a second voltage signal into a supply voltage in response to the switch circuit being turned off, to provide the supply voltage to the motherboard component; and
    wherein the control circuit comprises a first electronic switch, a first resistor, and a first capacitor; a first terminal of the first electronic switch is configured for receiving the startup signal, a second terminal of the first electronic switch is grounded, a third terminal of the first electronic switch is connected to the switch circuit, the first resistor is connected between the first power receiving terminal and the third terminal of the first electronic switch, the first capacitor is connected between the third terminal of the first electronic switch and ground; when the motherboard is turned on, the first voltage signal received by the first power receiving terminal is delayed by the first resistor and the first capacitor before being output to the switch circuit.

2. The circuit of claim 1, wherein the first electronic switch is an n-channel metal oxide semiconductor field effect transistor (NMOS-FET), the first, second, and third terminals of the first electronic switch correspond to a gate, a source, and a drain of the NMOS-FET.

3. The circuit of claim 1, wherein the switch circuit comprises second and third electronic switches; a first terminal of the second electronic switch is connected to the third terminal of the first electronic switch, a second terminal of the second electronic switch is connected to a power supply via a second resistor, a third terminal of the second electronic switch is grounded, a first terminal of the third electronic switch is connected to the second terminal of the second electronic switch, a second terminal of the third electronic switch is connected to the power conversion circuit, a third terminal of the third electronic switch is grounded; when the motherboard is turned on, the second electronic switch is turned on and the third switch is turned off, to make the power conversion circuit supply power to the motherboard component.

4. The circuit of claim 3, wherein the second and third electronic switches are n-channel metal oxide semiconductor field effect transistors (NMOS-FETs), the first, second, and third terminals of the second and third electronic switches correspond to gates, drains, and sources of the NMOS-FETs.

5. The circuit of claim 3, wherein the power supply is an about 5V standby power supply.

6. The circuit of claim 3, wherein the power conversion circuit comprises a pulse width modulation (PWM) chip, third to eighth resistors, a diode, second and third capacitors, first and second inductors, and first and second field effect transistors (FETs), wherein the PWM chip comprises a power supply terminal, a ground terminal, an initialization pin, a high pass pin, a low pass pin, a phase pin, a comparison pin, and a feedback pin, the feedback pin is grounded via the third resistor and connected to the motherboard component via the fourth resistor, the comparison pin is connected to the second terminal of the third electronic switch and connected to the phase pin via the fifth resistor, the power supply terminal is connected to the second power receiving terminal via the sixth resistor, the initialization pin is connected to a cathode of the diode and connected to the phase pin via the second capacitor, an anode of the diode is connected to the second power receiving terminal, the high pass pin is connected to a gate of the first FET via the seventh resistor, a drain of the first FET is connected to the second power receiving terminal via the first inductor, a source of the first FET is connected to a drain of the second FET and the phase pin, the source of the first FET is also grounded via the eighth resistor and the third capacitor in series and connected to the motherboard component via the second inductor, a gate of the second FET is connected to the low pass pin, a source of the second FET is grounded; when the motherboard is turned on, the high pass pin and the low pass pin of the PWM chip output high level signals alternately, the first FET and the second FET are turned on alternately, the second voltage signal received by the second power receiving terminal is converted into the supply voltage provided to the motherboard component.

7. The circuit of claim 6, wherein the power conversion circuit further comprises fourth to seventh capacitors; the fourth and fifth capacitors are connected between the drain of the first FET and ground in parallel, the sixth and seventh capacitors are connected between the motherboard and ground in parallel.

8. A circuit for controlling time sequence of a motherboard to supply power for a motherboard component, comprising:
   a control circuit connected to a startup signal output terminal to receive a startup signal, and connected to a first power receiving terminal to receive a first voltage signal, and configured to be turned on when the motherboard is shut off and the startup signal does not output from the startup signal output terminal;
   a switch circuit connected to the control circuit and configured to be turned on when the control circuit is turned on;
   a power conversion circuit connected between the switch circuit and a second power receiving terminal, wherein the power conversion circuit is configured to stop supplying power to the motherboard component when the switch circuit is turned on; and
   wherein the control circuit comprises a first electronic switch, a first resistor, and a first capacitor; a first terminal of the first electronic switch is configured for receiving the startup signal, a second terminal of the first electronic switch is grounded, a third terminal of the first electronic switch is connected to the switch circuit, the first resistor is connected between the first power receiving terminal and the third terminal of the first electronic switch, the first capacitor is connected between the third terminal of the first electronic switch and ground; when the motherboard is shut off, the first voltage signal received by the first power receiving terminal is not delayed, and a new voltage signal is output to the switch circuit.

9. The circuit of claim 8, wherein the switch circuit comprises second and third electronic switches; a first terminal of the second electronic switch is connected to the third terminal of the first electronic switch, a second terminal of the second electronic switch is connected to a power supply via a second resistor, a third terminal of the second electronic switch is grounded, a first terminal of the third electronic switch is connected to the second terminal of the second electronic switch, a second terminal of the third electronic switch is connected to the power conversion circuit, a third terminal of the third electronic switch is grounded; when the motherboard is shut off, the second electronic switch is turned off and the third switch is turned on, to make the power conversion circuit stops supplying power to the motherboard component.

10. The circuit of claim 9, wherein the power conversion circuit comprises a pulse width modulation (PWM) chip, third to eighth resistors, a diode, second and third capacitors, first and second inductors, and first and second field effect transistors (FETs), wherein the PWM chip comprises a power supply terminal, a ground terminal, an initialization pin, a high pass pin, a low pass pin, a phase pin, a comparison pin, and a feedback pin, the feedback pin is grounded via the third resistor, and connected to the motherboard component via the fourth resistor, the comparison pin is connected to the second terminal of the third electronic switch and connected to the phase pin via the fifth resistor, the power supply terminal is connected to the second power receiving terminal via the sixth resistor, the initialization pin is connected to a cathode of the diode and connected to the phase pin via the second capacitor, an anode of the diode is connected to the second power receiving terminal, the high pass pin is connected to a gate of the first FET via the seventh resistor, a drain of the first FET is connected to the second power receiving terminal via the first inductor, a source of the first FET is connected to a drain of the second FET and the phase pin, the source of the first FET is also grounded via the eighth resistor and the third capacitor in series and connected to the motherboard component via the second inductor, a gate of the second FET is connected to the low pass pin, a source of the second FET is grounded; when the motherboard is shut off, the PWM chip stops supplying power to the motherboard component.

11. The circuit of claim 10, wherein the power conversion circuit further comprises fourth to seventh capacitors; the fourth and fifth capacitors are connected between the drain of the first FET and ground in parallel, the sixth and seventh capacitors are connected between a power terminal of the motherboard and ground in parallel.

12. The circuit of claim 11, wherein the fourth and the seventh capacitors are electrolytic capacitors.

13. The circuit of claim 11, wherein the fourth and the seventh capacitors are solid state capacitors.

* * * * *